United States Patent [19]

Yoshizawa

[11] Patent Number: 4,570,279
[45] Date of Patent: Feb. 18, 1986

[54] APPARATUS FOR CLEANING GLASS MASKS

[75] Inventor: Takeshi Yoshizawa, Kawasaki, Japan

[73] Assignee: Fujitsu Limited, Kawasaki, Japan

[21] Appl. No.: 406,856

[22] Filed: Oct. 3, 1983

Related U.S. Application Data

[63] Continuation-in-part of Ser. No. 152,557, May 23, 1980, abandoned.

[30] Foreign Application Priority Data

May 28, 1979 [JP] Japan .................................. 54-71625

[51] Int. Cl.⁴ ............................................. B08B 11/02
[52] U.S. Cl. .................................. 15/97 R; 15/21 C; 15/102; 414/225
[58] Field of Search .................. 15/21 R, 21 C, 21 D, 15/21 E, 77, 97 R, 100, 102; 414/225, 226

[56] References Cited

U.S. PATENT DOCUMENTS

| | | | |
|---|---|---|---|
| 3,098,249 | 7/1963 | Tice et al. ............................. | 15/102 |
| 3,213,472 | 10/1965 | Cocchiaraley et al. ................ | 15/77 |
| 3,874,525 | 4/1975 | Hassan et al. ......................... | 414/225 |
| 3,939,514 | 2/1976 | Cook .................................... | 15/21 C |
| 4,062,463 | 12/1977 | Hillman et al. ....................... | 15/77 X |
| 4,109,337 | 8/1978 | Hillman et al. ....................... | 15/21 D |
| 4,138,755 | 2/1979 | Hashimoto ............................ | 15/77 |

Primary Examiner—Edward L. Roberts
Attorney, Agent, or Firm—Staas & Halsey

[57] ABSTRACT

An apparatus for cleaning glass masks used for the manufacture of semiconductor devices, which apparatus comprises a pair of rotary cleaning elements confronting each other and adapted to pour liquid therebetween, structure for supporting a cassette in which a plurality of glass masks to be cleaned are contained, and carriage structure by which the glass masks in the cassette are, one by one, pinched, carried to, and held in a position between the cleaning elments, in which position both surfaces of the glass mask are wiped by the cleaning elements and washed by the liquid poured from the cleaning elements.

6 Claims, 4 Drawing Figures

APPARATUS FOR CLEANING GLASS MASKS

This is a continuation-in-part application of application Ser. No. 152,557, filed on May 23, 1980, now abandoned.

BACKGROUND OF THE INVENTION

1. Field of the Invention

The present invention relates to an apparatus for cleaning a glass mask which is used for the manufacture of semiconductor devices.

2. Description of the Prior Art

The process of photolithography for semiconductor wafers, usually, a semiconductor wafer and a glass mask are exposed to light in the state where they are in close contact with each other. The glass mask, after being repeatedly used to be brought into close contact with the wafer, is soiled and, accordingly, requires cleaning before being used in the regeneration process. More specifically, since the glass mask is brought into close contact with the wafer, which is coated with a photosensitive resin or the like, the glass mask is soiled easily with fine residues of the photosensitive resin or the like, and accordingly dust in the air also sticks easily to the glass mask. Furthermore, there is a case where alkaline substances ooze out from the glass mask itself and stick to the surfaces of the glass mask.

Conventionally, the cleaning of the glass mask is performed by manual means or by means of various cleaning apparatuses. There is a conventional cleaning apparatus, in which the glass masks are radially disposed in a body of the apparatus in the form of a cylindrical vessel, and this vessel is rotated, while pure water is jetted from the central portion of the vessel. There is another conventional cleaning apparatus, in which a plurality of glass masks to be cleaned are radially disposed in a body of the apparatus, and this body is rotated in the state where the masks are dipped in pure water, whereby the surfaces of the respective glass masks are washed. In these conventional apparatuses, after completion of the washing operation, the vessel is rotated at a high speed so as to swish water off the masks by centrifugal force, whereby cleaned glass masks are obtained.

In the above-mentioned conventional cleaning apparatuses, however, the glass masks are radially disposed in the body of the apparatus and washed only by jetting pure water or by dipping the masks in pure water. Accordingly, soil struck to the mask, that is, fine residues of the photosensitive resin, oils and fats, such as finger marks of an operator, and alkaline substances oozing outfrom the glass mask, are not completely washed away; therefore the glass mask is not thoroughly cleaned. This is a defect involved in conventional cleaning apparatuses.

SUMMARY OF THE INVENTION

It is, therefore, a primary object of the present invention to provide an apparatus for cleaning glass masks, from which the above-mentioned defect is eliminated.

Another object of the present invention is to provide an apparatus for cleaning glass masks, in which both surfaces of the glass mask are wiped by rotating cleaning elements, whereby soil, such as residues, is removed from the surfaces of the glass mask.

The present invention provides an apparatus for cleaning glass masks, which comprises a pair of rotary cleaning elements confronting each other and adapted to pour liquid therebetween, means for supporting a cassette in which a plurality of glass masks are to be contained, and carriage means by which said glass masks in said cassette are, one by one, pinched and carried to, and held in, a position between said cleaning elements, in which position both surfaces of the glass mask are wiped by the cleaning elements and washed by the liquid poured from the cleaning elements.

In accordance with a preferred embodiment of the present invention, the cleaning elements comprise sponge discs secured to rotating shafts, respectively, and having end surfaces confronting each other, the end surfaces being adapted for wiping both surfaces of the glass mask held in position therebetween.

Each of the sponge discs is preferably provided with a nozzle for effecting flow of the liquid from the central portion of the end surface of each sponge disc.

Preferably, the end surface of each sponge disc is provided with spiral grooves extending from the central portion thereof.

The present invention will become apparent from the following description of a preferred embodiment with reference to the accompanying drawings.

DETAILED DESCRIPTION OF THE INVENTION

Figure 3:
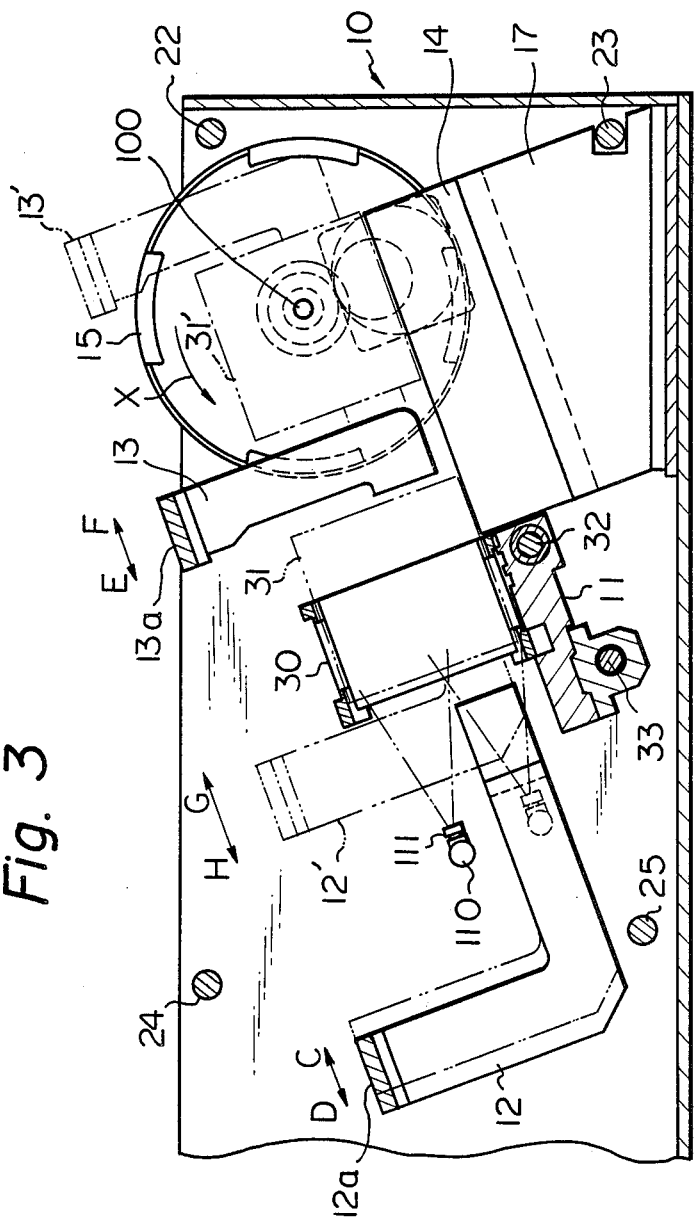
FIG. 3 is a partially sectional view taken along the line III—III in FIG. 1.

Referring to the drawings and, in particular, to FIG. 3, the illustrated apparatus for cleaning glass masks according to the present invention essentially comprises a frame 10, a loading stage 11, a pair of carriage members 12 and 13, a guide 14, and a pair of sponge discs 15 and 16. As illustrated more clearly in FIG. 1, the frame 10 includes an inner frame 20 made of, for example, polyvinyl chloride and an outer frame 21 made of, for example, aluminum. These inner and outer frames 20 and 21 are assembled together by means of rods 22, 23, 24, and 25.

The loading stage 11 is provided for supporting a cassette 30, which is adapted to contain therein a plurality of glass masks 31 (shown in phantom lines in FIG. 3) and to be removably secured to the loading stage 11. The cassette 30 has top and bottom walls which are individually provided with a plurality of slots arranged in the direction parallel to the plane of the drawing paper in FIG. 3 for receiving and holding the glass masks in parallel and spaced arrangement. The front and rear sides (right and left ends, respectively, in FIG. 3) of the cassette 30 are open to allow insertion and removal of the glass masks and movement of the carriage member 12 through the cassette 30, as will be described hereinafter, but the rear side (left end) is partially closed to prevent the movement of the glass masks therethrough.

Figure 1:
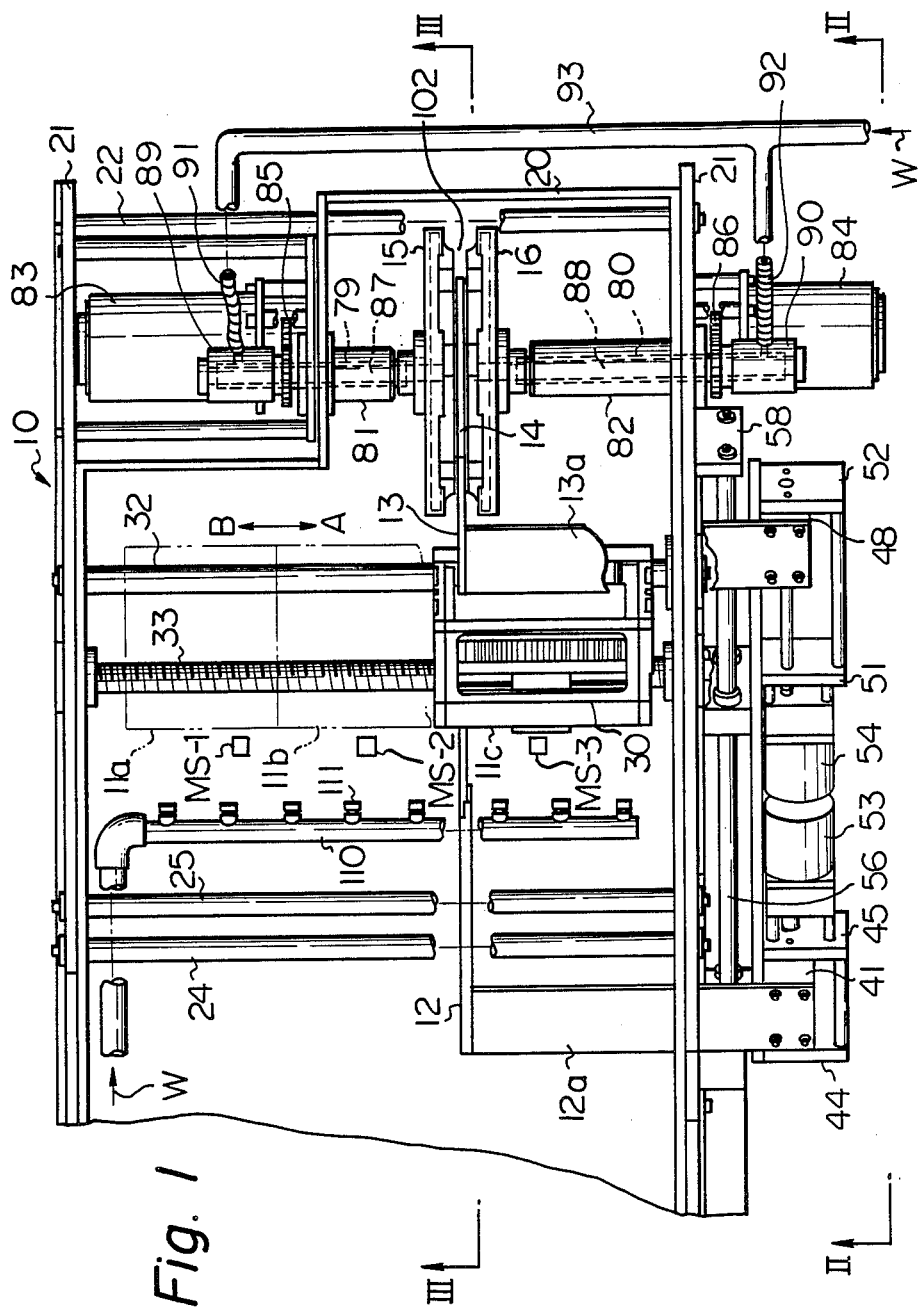
FIG. 1 is a partial plan view of an embodiment of an apparatus for cleaning glass masks according to the present invention.
Figure 2:
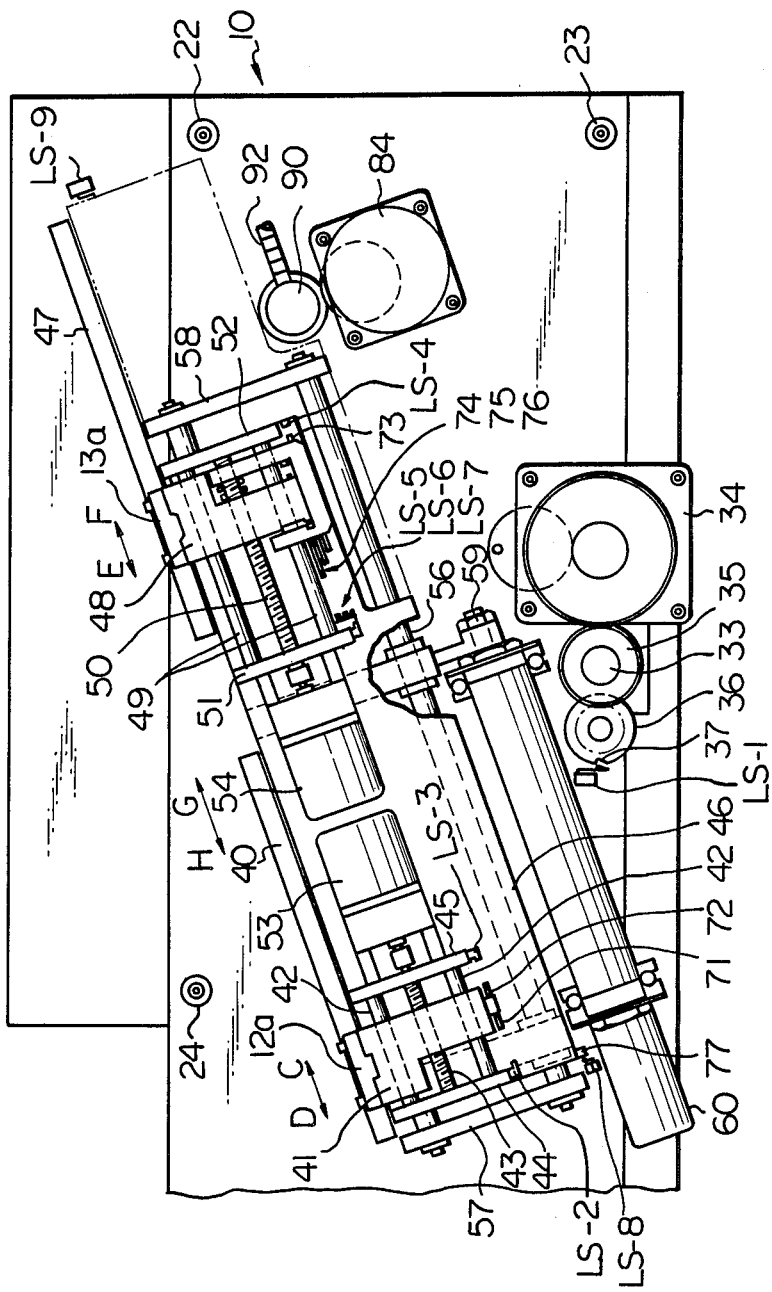
FIG. 2 is a partial side view taken along the line II—II in FIG. 1.

The loading stage 11 is mounted on a guide rod 32 and a screw-threaded rod 33, which are supported by the frame 10. The screw-threaded rod 33 is adapted to be rotated by a reversible motor 34 (FIG. 2), which is attached to the outside of the frame 10, through a gearing 35 (FIG. 2), so as to cause the loading stage 11 to move in the directions of the arrows A and B (FIG. 1). As will be described hereinafter, the movement of the loading stage 11 is controlled by means of magnetic switches MS-1, MS-2, and MS-3 (FIG. 1) and a limit switch LS-1 (FIG. 2), which are secured to the frame 10. The magnetic switches MS-1, MS-2, and Ms-3 are adapted to be energized by magnets (not illustrated) secured to the loading stage 11. The limit switch LS-1 is adapted to be actuated by a cam 36 with a notch 37 (FIG. 2), which is also rotated by the motor 34, through the gearing 35.

The carriage members 12 and 13 are provided for carriage of the individual glass mask 31, between the position within the cassette 30 and the position between the sponge discs 15 and 16, along the guide 14. As illustrated clearly in FIGS. 1 and 2, the carriage members 12 and 13 have arms 12a and 13a, which extend freely through slots 40 and 47 formed in the frame 10 and are secured to blocks 41 and 48, respectively. The blocks 41 and 48 are movably supported by a common carriage plate 46. That is, the block 41 is mounted on guide rods 42 and a screw-threaded rod 43, which are supported by brackets 44 and 45 secured to the carriage plate 46. The screw-threaded rod 43 is adapted to be rotated by a reversible motor 53 secured to the bracket 45, so as to cause the block 41 and thus the carriage member 12 to move in the directions of the arrows C and D. Similarly the block 48 is mounted on guide rods 49 and a screw-threaded rod 50, which are supported by brackets 51 and 52 secured to the carriage plate 46. The screw-threaded rod 50 is adapted to be rotated by a reversible motor 54 secured to the bracket 51, so as to cause the block 48 and thus the carriage member 13 to move in the directions of the arrows E and F. As will be described hereinafter, the movement of the block 41 is controlled by means of limit switches LS-2 and Ls-3, which are secured to the carriage plate 46 and adapted to be actuated by actuators 71 and 72 secured to the block 41, respectively. The movement of the block 48 is controlled by means of limit switches LS-4, LS-5, LS-6, and LS-7, which are secured to the carriage plate 46 and adapted to be actuated by actuators 73, 74, 75, and 76 secured to the block 48, respectively. The carriage plate 46 is mounted on guide rods 56 supported by a pair of brackets 57 and 58 secured to the frame 10, and is connected to a piston rod 59 of a pneumatic linear actuator 60 which is adapted to cause the carriage plate 46 and thus the carriage members 12 and 13 to move in the directions of the arrows G and H. As will be described hereinafter, the movement of the carriage plate 46 is controlled by means of limit switches LS-8 and LS-9, which are secured to the frame 10 and adapted to be actuated by an actuator 77 and the carriage plate 46 itself, respectively.

Figure 4:
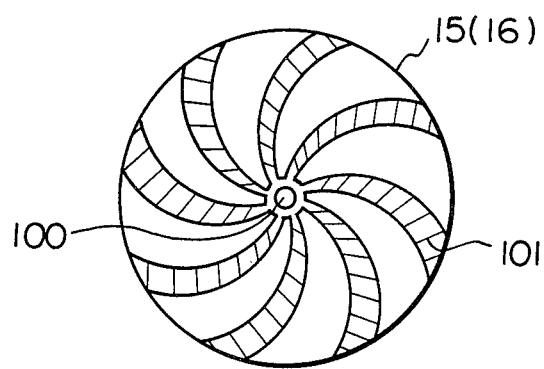
FIG. 4 diagramatically illustrates an end surface of a sponge disc of the apparatus shown in FIGS. 1 through 3.

Referring to FIG. 1, the sponge discs 15 and 17, that are cleaning elements, are attached to shafts 79 and 80 which are supported by sleeves 81 and 82 secured to the frame 10, respectively. The shafts 79 and 80 are rotated by motors 83 and 84 secured to the frame 10, through gearings 85 and 86, respectively, so that the sponge discs 15 and 17 rotate in the same direction of the arrow "X" (refer to FIG. 3). The sponge discs 15 and 16 have end surfaces, i.e. cleaning surfaces which confront each other with a space 102 therebetween. The width of the space 102, i.e. the distance between the cleaning surfaces of the sponge discs 15 and 16 is variable. As illustrated in FIGS. 3 and 4, each of the sponge discs 15 and 16 is provided at the center thereof with a nozzle 100. The nozzle 100 of the sponge discs 15 and 17 are in communication with conduits 87 and 88 which are defined in the shafts 81 and 82, respectively. The conduits 87 and 88 are, in turn, connected to a pipeline 93 for the supply of pure water "W", through swivel couplings 89 and 90 and flexible tubes 91 and 92, respectively. As illustrated in FIG. 4, the cleaning surfaces of the sponge discs 15 and 17 are individually provided with a plurality of spiral grooves 101 which extend from the nozzle 100. In FIG. 4, the spiral grooves 101 are illustrated with hatching lines for clear distinction.

Turning to FIG. 3, the guide 14 is secured to a support 17 which is fixed to the frame 10. The guide 14 is disposed at an angle with respect to the horizontal direction and extends in the space 102 between the sponge drums 15 and 17, as illustrated in FIGS. 1 and 3.

Furthermore, referring to FIGS. 1 and 3, the apparatus is provided with a pipeline 110 having a plurality of nozzles 111, for spraying pure water on the glass masks 31 within the cassette 30.

The operation of the apparatus will now be described. Initially, the loading stage 11 is in its home position 11a (shown in phantom lines in FIG. 1) in which the magnetic switch MS-1 is energized. In this home position 11a, a cassette 30 containing glass masks 31 is mounted on the loading stage 11. Moreover, the carriage plate 46 is in its home position in which the limit switch LS-8 is actuated by the actuator 77, the block 41 is in its home position in which the limit switch LS-2 is acutated by the actuator 71, and the clock 48 is in its home position in which the limit switch LS-4 is actuated by the actuator 73, so that the carriage members 12 and 13 are in the most retracted positions with respect to the path of movement of the loading stage 11.

When the operation starts, the loading stage 11 is first moved in the direction of the arrow A to a position 11b (shown in phantom lines in FIG. 1) in which the magnetic switch MS-2 is energized. In this position 11b, the first glass mask 31 is in alignment with the carriage members 12 and 13 and the guide 14.

Then the block 41 and thus the carriage member 12 are moved in the direction of the arrow C to the position in which the limit switch LS-3 is actuated by the actuator 72. In this position, the free end of the carriage member 12 engages the rear end of the glass mask 31. At the same time, the block 48 and thus the carriage member 13 are moved in the direction of the arrow E to the position in which the free end of the carriage member 13 engages the front end of the glass masks 31. This position of the carriage member 13 depends on the size of the glass mask 31. In the illustrated apparatus, this position can be adjusted in accordance with three kind of glass masks having different sizes, for example, 3-, 4-, and 5-inches square. That is, that actuators 74, 75, and 76 have different lengths corresponding to 5-, 4-, and 3-inch size glass masks, respectively, and, in the operation, the control circuit of the apparatus activates either one of the limit switches LS-5, LS-6, and LS-7, in accordance with the glass mask size. For the purpose, the apparatus is provided with a system for detecting the size of the glass mask, although not being illustrated in the drawings. That is, the 3-, 4-, and 5-inch size glass masks are contained in different cassettes having the corresponding sizes. These different size cassettes are provided with permanent magnets disposed at different positions, and the loading stage 11 is provided with three reed switches disposed at different positions corresponding to the positions of the magnets of the different size cassettes, respectively. When one of the different size cassettes, for example, the 3-inch size cassette, is mounted on the loading stage 11, the reed switch of the loading stage 11, corresponding to the magnet of the mounted cassette is energized and indicates that the mounted cassette is the 3-inch size cassette and thus the glass masks are 3-inch size masks. In this case, the limit switch LS-7 corresponding to the shortest actuator 76 is activated. In the manner described above, the glass mask 31 is pinched at its front and rear edges by the carriage members 12 and 13.

Then the carriage plate 46 is moved in the direction of the arrow G, so as to cause the carriage members 12 and 13 to carry the glass mask 31, along the guide 14, to a position 31' (shown in phantom lines in FIG. 3) between the sponge discs 15 and 16. In this position, the limit switch LS-9 is actuated by the carriage plate 46 itself, as illustrated in phantom lines in FIG. 2, and accordingly the glass mask 31 is held in this position 31'.

Then the sponge discs 15 and 16 are rotated and pure water is supplied to the nozzles 100 through the conduits 87 and 88. In this operation, rotating jets of pure water are produced, by virtue of the spiral grooves 101 formed on the cleaning surfaces of the glass mask held in the position 31' between the sponge discs. Accordingly, the glass mask is cleaned, in such the manner that both surfaces thereof are wiped by the cleaning surfaces of the sponge discs 15 and 16 and are washed by the above-mentioned rotating jets of pure water. In the case, for example, where a sufficient quantity of water is supplied and the sponge discs 15 and 16 are rotated at a rotation speed of 400 to 600 rpm for 2 to 5 seconds, the residues and soil on the surfaces of the glass mask are sufficiently removed.

After completion of the cleaning operation, the carriage plate 46 is moved in the direction of the arrow H so as to cause the carriage members 12 and 13 to return the cleaned glass mask from the position 31' between the sponge discs 15 and 16 to the position within the cassette 30. Then the carriage members 12 and 13 are moved in the directions of the arrows D and F to their home positions, respectively, so as to release the cleaned glass mask which remains in the cassette 30.

Subsequently, the loading stage 11 is moved from the position 11b to the next position in which the next glass mask is in alignment with the carriage members 12 and 13 and the guide 14, and the cleaning operation as described above is repeated. This intermittent movement continues until the loading stage 11 is moved to the position 11C, in which the cleaning operation for the last glass mask in the cassette is performed. This movement of the loading stage 11 is controlled by means of the limit switch LS-1 and the cam 36 (FIG. 1). That is, when the screw-threaded rod 33 has made the predetermined number of turns providing the movement of the loading stage 11 corresponding to the spacing between the adjacent glass masks in the cassette, the cam 36 makes one turn so that the notch 37 acutates the limit switch LS-1.

When the cleaning of all the glass masks contained in the cassette 30 has been completed, the loading stage 11 is moved in the direction of arrow B to return to its home position 11a, in which position the cassette 30 is removed from the loading stage 11.

The glass masks are spin-dried by a usual spin-drying method and, then dried in a clean bench. In accordance with the spin-drying method, the glass mask is spin-dried off by rotating the mask at a rotational speed of 1000 rpm for 40 seconds.

The apparatus for cleaning glass masks according to the present invention, one embodiment of which has been described above, provides for a very high cleaning effect. Accordingly, in the case where the degree of soiling is not too high, the glass masks can be cleaned completely by means of the sponge discs and the jets of pure water, event if a preliminary washing treatment is not performed.

By the cleaning apparatus of the present invention, dust and soil having a size of 1 to 1.5 $\mu$m or more can be removed, and more than 95% of the stuck solids can be washed away. In a case of a glass mask that has been used many times and in which the degree of soiling is high, and the soil is of a type that is difficult to removed, the cleaning effect can be improved by performing a preliminary washing treatment using chemicals.

The degree of soiling and the amount of stuck substances on the glass mask are determined by visual inspection and microscopic observation, and, based on these results, it can be decided whether or not a preliminary washing treatment should be performed.

It should be understood that the present invention has been described above in detail with particular reference to the preferable embodiments thereof, but variations and modifications can be made thereto within the spirit and scope of the invention.

I claim:

1. An apparatus for cleaning glass masks, comprising: a pair of rotary cleaning elements confronting each other including a pair of sponge discs each secured respectively to a horizontally rotating shaft, said pair of sponge discs having end surfaces confronting each other, said end surfaces being used for wiping both surfaces of the glass mask held in said position therebetween, and said cleaning elements further including liquid flow means for pouring liquid therebetween; supporting means for supporting a cassette in which a plurality of glass masks are contained; and carriage means including pinching means for pinching each of respective glass masks by pressing a pair of opposed edges of the same, and carrying means for carrying the glass masks, one by one, to a position between said cleaning elements, in which position both surfaces of the glass mask are wiped by the cleaning elements and washed by the liquid poured from the liquid flow means.

2. An apparatus according to claim 1, wherein said liquid flow means comprises a nozzle with each sponge disc for effecting a flow of liquid from the central portion of the end surface of the sponge disc.

3. An apparatus according to claim 2, wherein said end surface of each of the sponge discs is provided with spiral grooves extending from the central portion thereof.

4. An apparatus according to claim 1, wherein said cassette supporting means comprises a cassette holding portion to which said cassette is removably secured, and a guide portion along which each respective glass mask is carried one by one by said carriage means.

5. An apparatus according to claim 4, wherein said cassette holding portion is movable from a position in which the cleaning of one of said glass masks is performed to a subsequent position in which the cleaning of another glass mask is performed.

6. An apparatus according to claim 1, wherein said pinching means comprises a pair of members adapted to press a pair of opposed edges of the glass mask, whereby the glass mask is pinched.

* * * * *